United States Patent
Zadeh et al.

(10) Patent No.: US 10,176,993 B2
(45) Date of Patent: Jan. 8, 2019

(54) SEMICONDUCTOR DEVICE AND METHOD OF MANUFACTURING THE SAME

(71) Applicant: NIPPON TELEGRAPH AND TELEPHONE CORPORATION, Tokyo (JP)

(72) Inventors: Dariush Zadeh, Tokyo (JP); Shinichi Tanabe, Tokyo (JP); Noriyuki Watanabe, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/569,743

(22) PCT Filed: Apr. 12, 2016

(86) PCT No.: PCT/JP2016/061790
§ 371 (c)(1),
(2) Date: Oct. 26, 2017

(87) PCT Pub. No.: WO2016/175024
PCT Pub. Date: Nov. 3, 2016

(65) Prior Publication Data
US 2018/0130661 A1    May 10, 2018

(30) Foreign Application Priority Data
Apr. 30, 2015    (JP) .................... 2015-092937

(51) Int. Cl.
*H01L 21/225*    (2006.01)
*H01L 21/28*    (2006.01)
(Continued)

(52) U.S. Cl.
CPC .......... *H01L 21/2258* (2013.01); *H01L 21/28* (2013.01); *H01L 21/28575* (2013.01);
(Continued)

(58) Field of Classification Search
CPC ........... H01L 21/2258; H01L 21/28575; H01L 21/3215; H01L 29/0843; H01L 29/452; H01L 29/205; H01L 29/7787
See application file for complete search history.

(56) References Cited

U.S. PATENT DOCUMENTS

2006/0019435 A1* 1/2006 Sheppard .......... H01L 29/66462
438/167

FOREIGN PATENT DOCUMENTS

JP    2014-222724 A    11/2014

OTHER PUBLICATIONS

Z.H. Liu et al., "Temperature dependence of Ohmic contact characteristics in AlGaN/GaN high electron mobility transistors from 50 to 200° C.", Applied Physics Letters, vol. 94, No. 14, 142105, 2009.
(Continued)

*Primary Examiner* — Karen Kusumakar
(74) *Attorney, Agent, or Firm* — Womble Bond Dickinson (US) LLP

(57) ABSTRACT

A third semiconductor layer (105) including a third nitride semiconductor is provided between an electrode (110) and a second semiconductor layer (104) including a second nitride semiconductor. The band gap of the second nitride semiconductor is set such that the carrier movement between a first semiconductor layer (103) and the third semiconductor layer (105) via the second semiconductor layer (104) is rate-determined by a diffusion process. The thickness of the second semiconductor layer (104) is set such that the carrier movement between the first semiconductor layer (103) and the third semiconductor layer (105) via the second semiconductor layer (104) is rate-determined by the diffusion process. The carrier movement between the first semiconductor
(Continued)

layer (103) and the third semiconductor layer (105) via the second semiconductor layer (104) is rate-determined by a field emission process.

10 Claims, 5 Drawing Sheets

(51) Int. Cl.
*H01L 21/285* (2006.01)
*H01L 21/3215* (2006.01)
*H01L 29/08* (2006.01)
*H01L 29/45* (2006.01)
*H01L 29/778* (2006.01)
*H01L 29/205* (2006.01)
*H01L 29/20* (2006.01)

(52) U.S. Cl.
CPC ...... *H01L 21/3215* (2013.01); *H01L 29/0843* (2013.01); *H01L 29/452* (2013.01); *H01L 29/7786* (2013.01); *H01L 29/2003* (2013.01); *H01L 29/205* (2013.01); *H01L 29/7787* (2013.01)

(56) References Cited

OTHER PUBLICATIONS

M.W. Fay et al., "Structural and electrical characterization of AuPdAlTi ohmic contacts to AlGaN/GaN with varying Ti content", Journal of Applied Physics, vol. 96, No. 10, pp. 5588-5595, 2004.

\* cited by examiner

SEMICONDUCTOR DEVICE AND METHOD OF MANUFACTURING THE SAME

TECHNICAL FIELD

The present invention relates to a semiconductor device made of a nitride semiconductor and a method of manufacturing the same.

BACKGROUND ART

Transistors using nitride semiconductors with electron mobility higher than that of silicon have been researched and developed actively and also put into actual use. For example, gallium nitride (GaN) is a semiconductor having a band gap larger than that of Si. It is therefore possible to produce an element that stably operates in the range of a low temperature to a high temperature as compared to Si and is also capable of high voltage/high current driving. For this reason, a transistor using GaN for a channel is expected to be used as a switching element to be mounted in a consumer electrical appliance or a vehicle.

For example, a so-called two-dimensional electron gas (2DEG) having a high concentration and high mobility is formed in the interface between an AlGaN layer and a GaN layer which are crystal-grown using a c plane as a principal plane. There exists a high electron mobility transistor (HEMT) using the 2DEG as a channel. This transistor can be used as a switching element that exhibits a low ON resistance and a high breakdown voltage. For example, a HEMT using AlGaN/GaN is employed as a transistor for a communication satellite that functions in an environment with a large temperature change from about −150° C. to about 250° C.

To implement such a high-performance transistor that stably operates regardless of a change in the ambient temperature, it is important that, for example, the contact resistance of the source electrode and the drain electrode is low and does not change in accordance with the temperature. However, when a transistor is formed using a nitride semiconductor in which a threading dislocation exists, for example, a nitride semiconductor epitaxially grown on a substrate of a different type such as an SiC substrate, a sapphire substrate, or an Si substrate, in a HEMT using AlGaN/GaN, the contact resistance of the source electrode and the drain electrode changes in accordance with a measurement temperature. For example, it has been reported that in a HEMT using AlGaN/GaN on a Si substrate, when the measurement temperature is changed from room temperature to 200° C., the contact resistance changes to about 1/5 from about $5 \times 10^{-5}$ Ωcm² to about $1 \times 10^{-5}$ Ωcm² (see non-patent literature 1).

A change in the contact resistance depending on the temperature is reported for a HEMT using AlGaN/GaN on a sapphire substrate as well (see non-patent literatures 1 and 2). Such a change in the contact resistance depending on the temperature is a factor for impeding the stable operation of the transistor functioning in an environment with a large temperature change.

The ohmic junction of each of the source electrode and the drain electrode of the HEMT using AlGaN/GaN is generally obtained by depositing metals in the order of Ti, Al, Ni, and Au and heating (sintering) them at a temperature of about 850° C. in a nitrogen atmosphere, as in non-patent literature 1. As the conduction mechanism in the interface between the semiconductor and the metal, three mechanisms, that is, mechanisms by field emission, thermionic field emission, and thermionic emission can mainly be assumed. The conduction mechanisms by thermionic field emission and thermionic emission promote carrier movement on the semiconductor-metal interface along with an increase in the temperature and lower the contact resistance along with the increase in the temperature. On the other hand, in field emission, carrier movement is caused by tunnel conduction, and therefore, the contact resistance does not change depending on the temperature.

In a general ohmic electrode including non-patent literature 1, AlGaN that lacks nitrogen (since a nitrogen vacancy serves as a donor, AlGaN is in an electron-doped state) is generated by the reaction between a metal and a nitride semiconductor (AlGaN), as shown in the band diagram of FIG. 7. The region that lacks nitrogen is defined as a region I. Since the energy barrier of the region I is thin, electrons move between the region and the metal by a tunneling process. That is, electron movement by field emission occurs.

On the other hand, to cause the electrons to move through the energy barrier (region II) between the metal and unreacted AlGaN, thermal energy is needed to move across the energy barrier. Hence, if the temperature rises, the electrons readily move across the energy barrier of the region II. For this reason, the contact resistance lowers along with the increase in the temperature. This is the very conduction mechanism by thermionic field emission. In non-patent literature 1, it is reported that in AlGaN/GaN on an Si substrate having a threading dislocation density on the order of $10^9$ cm$^{-2}$, since the conduction mechanism by thermionic field emission via the region II is dominant, temperature dependence of the contact resistance is generated.

Additionally, as described in non-patent literature 2, in AlGaN/GaN on a sapphire substrate generally having a threading dislocation density on the order of $10^9$ cm$^{-2}$, a structure in which part of a metal contacts GaN via a threading dislocation is generated by a sintering process. The interface between GaN and the metal in contact with GaN via the threading dislocation forms a Schottky junction. Temperature dependence of the contact resistance is considered to be generated because carrier conduction in the Schottky junction is dominated by thermionic field emission.

RELATED ART LITERATURE

Non-Patent Literature

Non-Patent Literature 1: Z. H. Liu et al., "Temperature dependence of Ohmic contact characteristics in AlGaN/GaN high electron mobility transistors from 50 to 200° C.", APPLIED PHYSICS LETTERS, vol. 94, no. 14, 142105, 2009.

Non-Patent Literature 2: M. W. Fay et al., "Structural and electrical characterization of AuPdAlTi ohmic contacts to AlGaN/GaN with varying Ti content", JOURNAL OF APPLIED PHYSICS, vol. 96, no. 10, pp. 5588-5595, 2004.

DISCLOSURE OF INVENTION

Problem to be Solved by the Invention

As described above, in the conventional semiconductor device made of a nitride semiconductor, the contact resistance of each of the source electrode and the drain electrode changes depending on the temperature. Hence, the semiconductor device cannot be operated stably in an environment with a large temperature change.

The present invention has been made to solve the above-described problem, and an object of the present invention is to stably operate a semiconductor device including a nitride semiconductor even in an environment with a large temperature change.

Means of Solution to the Problem

According to the present invention, there is provided a semiconductor device including a first semiconductor layer including a first nitride semiconductor and formed on a substrate, a second semiconductor layer including a second nitride semiconductor having a band gap larger than that of the first nitride semiconductor and formed in contact with an upper surface of the first semiconductor layer, a third semiconductor layer including a third nitride semiconductor of a conductivity type having a band gap equal to or greater than that of the second nitride semiconductor and formed in contact with an upper surface of the second semiconductor layer, and an electrode including a metal nitride and formed in contact with an upper surface of the third semiconductor layer, wherein the second nitride semiconductor has a band gap with which a carrier movement between the first semiconductor layer and the third semiconductor layer via the second semiconductor layer is rate-determined by a diffusion process, the second semiconductor layer has a thickness with which the carrier movement between the first semiconductor layer and the third semiconductor layer via the second semiconductor layer is rate-determined by the diffusion process, and the carrier movement between the first semiconductor layer and the third semiconductor layer via the second semiconductor layer is rate-determined by a field emission process.

According to the present invention, there is also provided a method of manufacturing a semiconductor device, including the first step of forming a first semiconductor layer including a first nitride semiconductor on a substrate, the second step of forming a second semiconductor layer including a second nitride semiconductor having a band gap larger than that of the first nitride semiconductor in contact with an upper surface of the first semiconductor layer, the third step of forming an electrode including a metal in contact with an upper surface of the second semiconductor layer, and the fourth step of making the metal of the electrode react with the second nitride semiconductor of the second semiconductor layer by a sintering process by heating, forming a third semiconductor layer including a third nitride semiconductor of a conductivity type having a band gap equal to or greater than that of the second nitride semiconductor in contact with an upper surface of the second semiconductor layer, and forming the electrode including a nitride of the metal in contact with an upper surface of the third semiconductor layer, wherein in the fourth step, the sintering process is performed until the second nitride semiconductor of the second semiconductor layer obtains a band gap with which a carrier movement between the first semiconductor layer and the third semiconductor layer via the second semiconductor layer is rate-determined by a diffusion process, and the second semiconductor layer obtains a thickness with which the carrier movement between the first semiconductor layer and the third semiconductor layer via the second semiconductor layer is rate-determined by the diffusion process, and the carrier movement between the first semiconductor layer and the third semiconductor layer via the second semiconductor layer is rate-determined by a field emission process.

According to the present invention, there is also provided a method of manufacturing a semiconductor device, including the first step of forming a first semiconductor layer including a first nitride semiconductor on a substrate, the second step of forming a second semiconductor layer including a second nitride semiconductor having a band gap larger than that of the first nitride semiconductor in contact with an upper surface of the first semiconductor layer, the third step of forming a third semiconductor layer including a third nitride semiconductor of a conductivity type having a band gap equal to or greater than that of the second nitride semiconductor in contact with an upper surface of the second semiconductor layer, and the fourth step of forming an electrode including a metal nitride in contact with an upper surface of the third semiconductor layer, wherein the second nitride semiconductor has a band gap with which a carrier movement between the first semiconductor layer and the third semiconductor layer via the second semiconductor layer is rate-determined by a diffusion process, the second semiconductor layer has a thickness with which the carrier movement between the first semiconductor layer and the third semiconductor layer via the second semiconductor layer is rate-determined by the diffusion process, and the carrier movement between the first semiconductor layer and the third semiconductor layer via the second semiconductor layer is rate-determined by a field emission process.

Effect of the Invention

As described above, according to the present invention, it is possible to obtain a great effect of stably operating a semiconductor device including a nitride semiconductor even in an environment with a large temperature change.

BEST MODE FOR CARRYING OUT THE INVENTION

Embodiments of the present invention will now be described with reference to the accompanying drawings.

First Embodiment

Figure 1A:
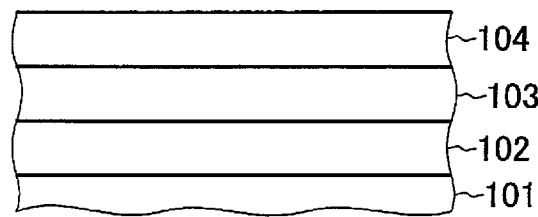
FIG. 1A is a view showing the states of steps so as to explain a semiconductor device according to the first embodiment of the present invention and a method of manufacturing the same.
Figure 1B:
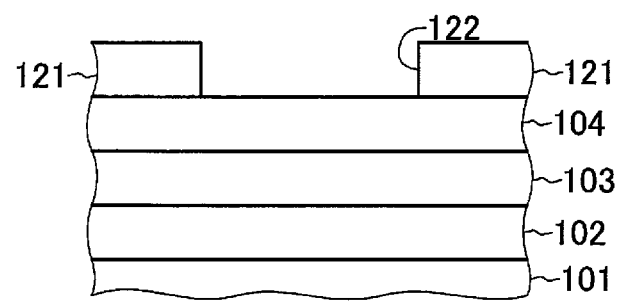
FIG. 1B is a view showing the states of steps so as to explain the semiconductor device according to the first embodiment of the present invention and the method of manufacturing the same.
Figure 1C:
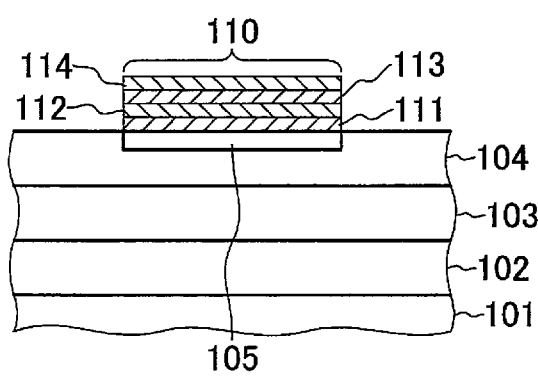
FIG. 1C is a view showing the states of steps so as to explain the semiconductor device according to the first embodiment of the present invention and the method of manufacturing the same.

The first embodiment of the present invention will be described first with reference to FIGS. 1A to 1C. FIGS. 1A to 1C are views showing the states of steps so as to explain a semiconductor device according to the first embodiment of the present invention and a method of manufacturing the same. FIGS. 1A to 1C schematically show a section.

First, as shown in FIG. 1A, a buffer layer 102, a first semiconductor layer 103, and a second semiconductor layer 104 are formed on a substrate 101 (first and second steps). The second semiconductor layer 104 is formed in contact with the upper surface of the first semiconductor layer 103. The layers are sequentially epitaxially grown by well-known molecular beam epitaxy (MBE) or metalorganic chemical vapor deposition (MOCVD).

The substrate 101 is a crystal substrate made of, for example, GaN having a threading dislocation density of $1 \times 10^7$ cm$^{-2}$ or less. The principal plane of the substrate 101 is the (0001) plane in the plane orientation, which is a III polar plane. The buffer layer 102 is made of, for example, GaN doped with C, Mg, Fe, or the like. If the substrate 101 has conductivity, a current flowing to the substrate 101 can be prevented by forming the buffer layer 102.

The first semiconductor layer 103 is made of a first nitride semiconductor, and the second semiconductor layer 104 is made of a second nitride semiconductor having a band gap larger than that of the first nitride semiconductor. As a combination of components, the first semiconductor layer 103 is made of undoped GaN, and the second semiconductor layer 104 is made of AlGaN. In this case, the first semiconductor layer 103 is formed to a thickness of about 300 nm. The second semiconductor layer 104 contains 23% Al in AlGaN and has a thickness of 21.8 nm.

In the first embodiment, the substrate 101 is made of GaN. Since no lattice mismatch exists between the first semiconductor layer 103 and the substrate 101, a threading dislocation that occurs due to lattice mismatch can be suppressed. As a result, the threading dislocation density in the first semiconductor layer 103 and the second semiconductor layer 104 equals the threading dislocation density of the substrate 101 and can be $1 \times 10^7$ cm$^{-2}$ or less.

In general, when depositing a semiconductor layer on a substrate, occurrence of a dislocation can be suppressed if the thickness is not more than a so-called critical film thickness. Hence, if the substrate 101 is made of not GaN but a material with relatively small lattice mismatch, occurrence of a dislocation can be suppressed even if a nitride semiconductor layer with a practically needed thickness is deposited. For example, if a ZnO substrate or ScAlMgO$_4$ substrate whose lattice mismatch with GaN is 1.8% is used, the critical thickness is about 100 nm. Hence, the effect of the present invention can be obtained by a structure in which a nitride semiconductor layer with a practically needed thickness is deposited.

Next, as shown in FIG. 1B, a resist pattern 121 is formed on the second semiconductor layer 104. The resist pattern 121 includes, in an electrode formation region, an opening portion 122 that reaches the second semiconductor layer 104. The resist pattern 121 is formed by well-known photolithography. The resist pattern 121 is used as a lift-off mask, as will be described below.

Next, an electrode material is deposited by, for example, electron-beam evaporation, and the resist pattern 121 is lifted off, thereby forming an electrode 110 including a first metal layer 111, a second metal layer 112, a third metal layer 113, and a fourth metal layer 114, as shown in FIG. 1C (third step). For example, Ti, Al, Mo, and Au are deposited in this order, thereby forming the first metal layer 111, the second metal layer 112, the third metal layer 113, and the fourth metal layer 114.

Next, a sintering process is performed in N$_2$ to make Ti of the first metal layer 111 react with AlGaN of the second semiconductor layer 104 to form an ohmic electrode. In addition, a third semiconductor layer 105 is formed under the first metal layer 111 (fourth step). The third semiconductor layer 105 is formed in contact with the second semiconductor layer 104. The first metal layer 111 included in the electrode 110 is formed in contact with the third semiconductor layer 105. The first metal layer 111 of the electrode 110 is an electrode made of a metal nitride.

The formed third semiconductor layer 105 lacks nitrogen (has nitrogen vacancies). Since the nitrogen vacancies serve as a conductive impurity, the third semiconductor layer 105 has a sufficiently high carrier (electron) concentration and thus has a conductivity type (n type). In addition, the third semiconductor layer 105 has an Al content higher than that of the second semiconductor layer 104. A third nitride semiconductor of the third semiconductor layer 105 has a band gap not less than that of the second nitride semiconductor of the second semiconductor layer 104.

Note that the third metal layer 113 made of Mo has a function of preventing Al of the second metal layer 112 from diffusing to the fourth metal layer 114 made of Au and efficiently diffusing Al to the side of the second semiconductor layer 104 made of AlGaN during the sintering process. The same effect can be obtained using not Mo but a metal having a melting point higher than the sintering temperature, for example, Ni or W. By the above-described sintering process, the first metal layer 111 is made of a metal nitride (TiN).

With the above process, the third semiconductor layer 105 made of the third nitride semiconductor is provided between the electrode 110 and the second semiconductor layer 104 made of the second nitride semiconductor. The band gap of the second nitride semiconductor is set such that the carrier movement between the first semiconductor layer 103 and the third semiconductor layer 105 via the second semiconductor layer 104 is rate-determined by a diffusion process. The thickness of the second semiconductor layer 104 is set such that the carrier movement between the first semiconductor layer 103 and the third semiconductor layer 105 via the second semiconductor layer 104 is rate-determined by the diffusion process. The carrier movement between the first semiconductor layer 103 and the third semiconductor layer 105 via the second semiconductor layer 104 is rate-determined by a field emission process. In this arrangement, the third semiconductor layer 105 has a conductivity type by having nitrogen vacancies as a conductive impurity, as described above.

In other words, in the above-described sintering process (fourth step), the sintering process is performed until
  the second nitride semiconductor of the second semiconductor layer 104 obtains a band gap with which the carrier movement between the first semiconductor layer 103 and the third semiconductor layer 105 via the second semiconductor layer 104 is rate-determined by the diffusion process, and
  the second semiconductor layer 104 obtains a thickness with which the carrier movement between the first semiconductor layer 103 and the third semiconductor layer 105 via the second semiconductor layer 104 is rate-determined by the diffusion process, and
  the carrier movement between the first semiconductor layer 103 and the third semiconductor layer 105 via the second semiconductor layer 104 is rate-determined by the field emission process.

Figure 7:
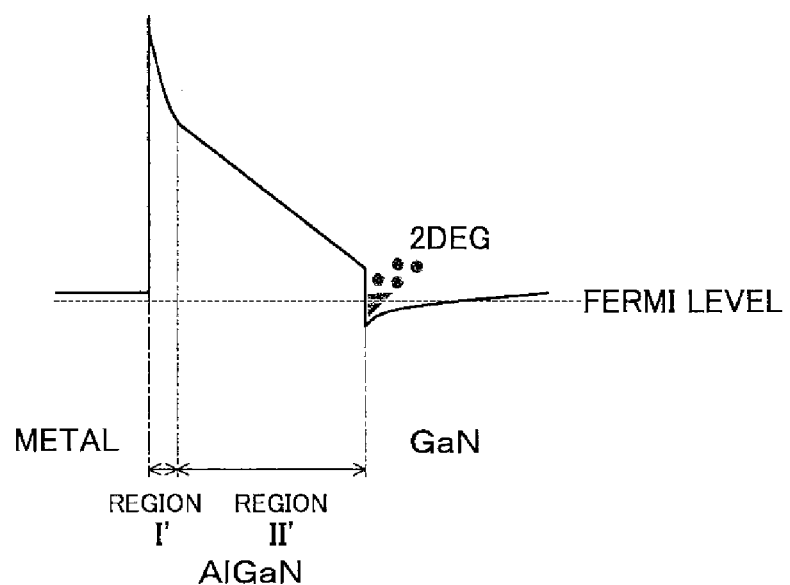
FIG. 7 is a band diagram showing the band state of a semiconductor device using a nitride semiconductor by a general ohmic electrode.

Development up to the present invention will be described next. The present inventors found, by extensive examinations, that in the above-described sintering process in $N_2$, there existed a case in which an ohmic electrode in which thermionic field emission described with reference to FIG. 7 was dominant was obtained and a case in which an ohmic electrode in which field emission and diffusion conduction to attain the band state shown in FIG. 2 were dominant was obtained depending on the sintering condition.

Figure 2:
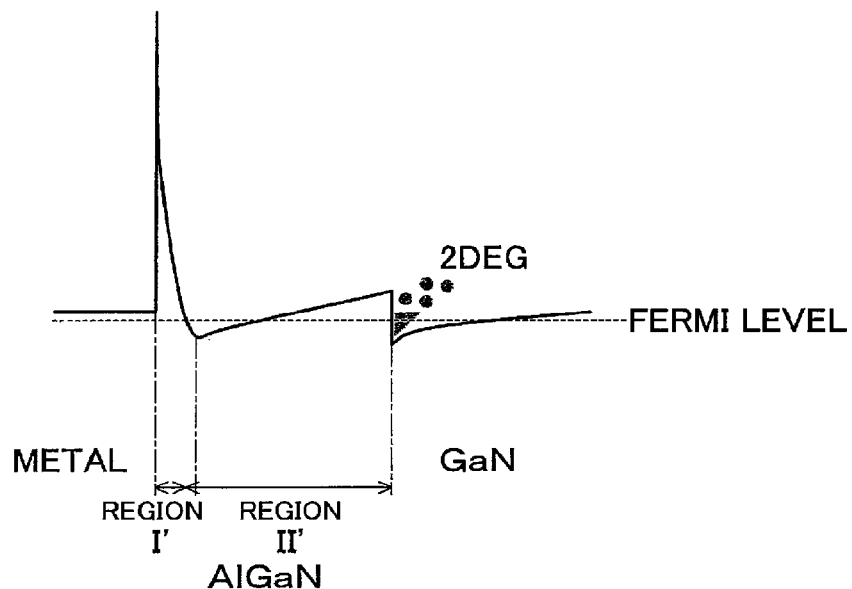
FIG. 2 is a band diagram showing the band state of the semiconductor device according to the embodiment of the present invention.

FIG. 2 is a band diagram showing a typical band state in the electrode structure according to the present invention. Referring to FIG. 2, a metal corresponds to the first metal layer 111 of the electrode 110, a region I' of AlGaN corresponds to the third semiconductor layer 105, a region II' of AlGaN corresponds to the second semiconductor layer 104, and GaN corresponds to the first semiconductor layer 103.

As described above, AlGaN in the region I' contains nitrogen vacancies and thus has a sufficiently high carrier concentration. For this reason, the carrier conduction mechanism between the metal and AlGaN in the region I' is manly implemented by field emission.

Additionally, as described above, by the spontaneous polarization and piezoelectric polarization effect produced by the Al content higher than that of AlGaN in the region II', polarization charges are formed in the interface between the region I' and the region II' to lower the energy in the conduction band. As a result, the energy barrier of AlGaN (region II') on the side contacting GaN lowers. This lowers the height of the energy barrier existing in the interface between the regions I' and II' and thus facilitates carrier conduction in the region II'. Furthermore, a state in which the internal field in the region II' hardly exists can be created by appropriately selecting the thickness of the region II'. In this state, the carrier in the region II' is dominated not by thermionic field emission but by diffusion conduction.

By the arrangement according to the first embodiment for obtaining the above-described band structure shown in FIG. 2, an electrode structure in which the carrier conduction between the electrode 110 and the first semiconductor layer 103 is dominated by field emission and diffusion conduction can be formed, and the temperature dependence of the contact resistance in the electrode 110 can be suppressed.

In other words, if the following three points are satisfied, the carrier in the region II' is dominated by diffusion conduction, and the temperature dependence of the contact resistance in the electrode 110 can be suppressed.

First, the second nitride semiconductor of the second semiconductor layer 104 has a band gap with which the carrier movement between the first semiconductor layer and the third nitride semiconductor of the third semiconductor layer 105 via the second semiconductor layer is rate-determined by the diffusion process.

Second, the second semiconductor layer 104 has a thickness with which the carrier movement between the first semiconductor layer 103 and the third semiconductor layer 105 via the second semiconductor layer 104 is rate-determined by the diffusion process.

Third, the carrier movement between the first semiconductor layer 103 and the third semiconductor layer 105 via the second semiconductor layer 104 is rate-determined by the field emission process.

To effectively obtain the above-described effect, it is important to avoid direct contact between the metal and the nitride semiconductor via the threading dislocation as reported in non-patent literature 2. To avoid direct contact between the metal and the nitride semiconductor via the threading dislocation, a substrate whose lattice mismatch with the first nitride semiconductor of the first semiconductor layer is 2% or less is used.

For example, a result obtained by evaluating, by measurement using a transmission line model (TLM), the temperature dependences of the contact resistances of electrodes that have undergone a sintering process at a sintering temperature of 700° C. and a sintering process at a sintering temperature of 900° C. is shown. Samples will be described. First, a TiN layer, an Al layer, an Mo layer, and an Au layer are stacked in this order on an AlGaN layer serving as the second semiconductor layer to form an electrode structure. In each electrode, the TiN layer is made of a metal nitride. The process time of the sintering process is 30 sec for both samples.

Figure 3A:
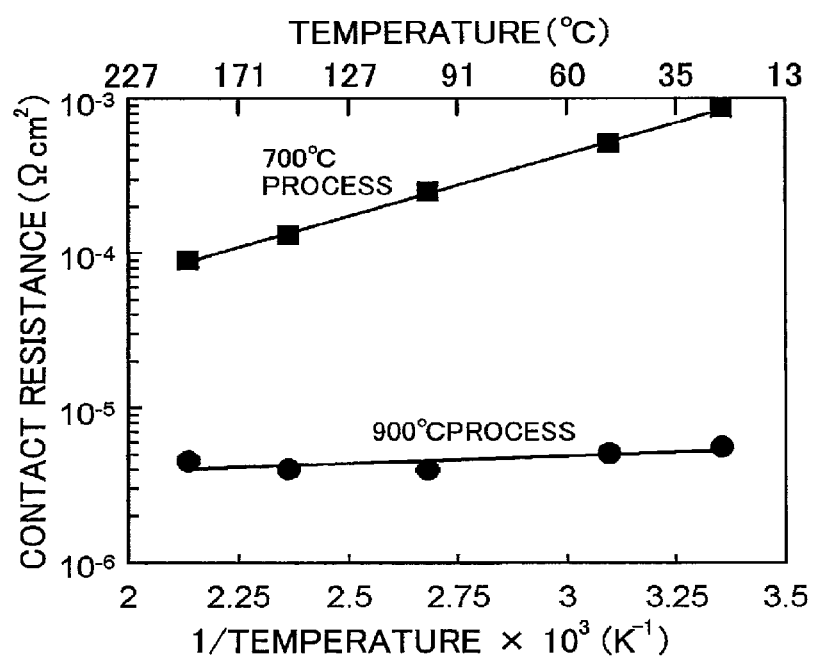
FIG. 3A is a graph showing a result obtained by evaluating, by measurement using a transmission line model, the temperature dependences of the contact resistances of electrodes that have undergone a sintering process at a sintering temperature of 700° C. and a sintering process at a sintering temperature of 900° C.
Figure 3B:
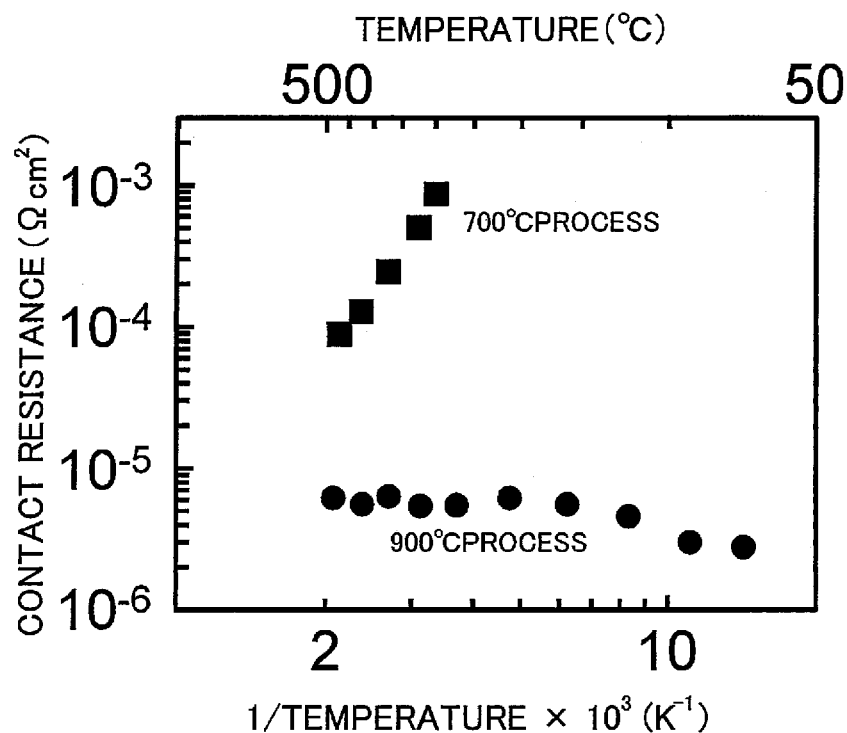
FIG. 3B is a graph showing a result obtained by evaluating, by measurement using a transmission line model, the temperature dependences of the contact resistances of electrodes that have undergone a sintering process at a sintering temperature of 700° C. and a sintering process at a sintering temperature of 900° C.

In the electrode processed at 700° C., as indicated by full squares in FIGS. 3A and 3B, the contact resistance that was $8.7 \times 10^{-4}$ $\Omega cm^2$ at room temperature lowered along with an increase in the measurement temperature and showed a tendency to decrease to $9.0 \times 10^{-5}$ $\Omega cm^2$ by about one order of magnitude at 200° C. This result strongly suggests that the carrier conduction is dominated by thermionic field emission.

On the other hand, if the electrode was processed at a sintering temperature of 900° C., as indicated by full circles in FIG. 3A, the contact resistance that was $5.6 \times 10^{-6}$ $\Omega cm^2$ at room temperature hardly changed even if the measurement temperature changed, and changed to $4.5 \times 10^{-6}$ $\Omega cm^2$ at 200° C. Additionally, if the electrode was processed at a sintering temperature of 900° C., as indicated by full circles in FIG. 3B, an increase in the contact resistance was not observed even if the measurement temperature changed to a very low temperature of about 50K.

Figure 4:
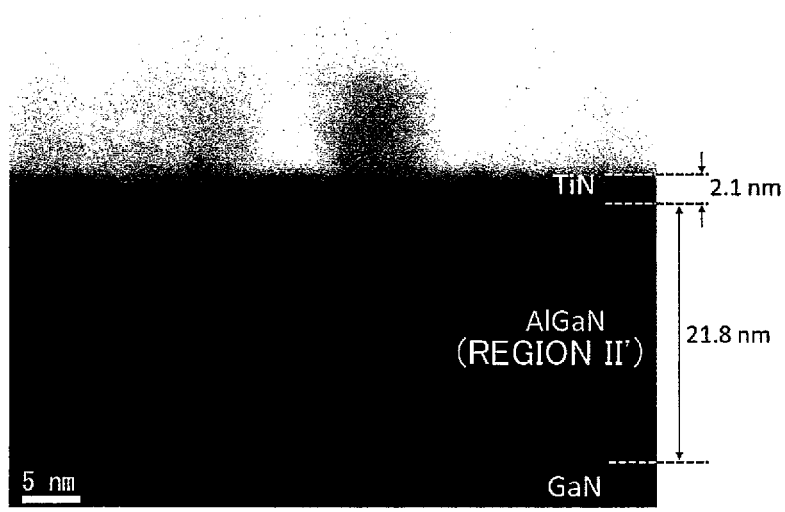
FIG. 4 is a photo showing a transmission electron micrograph of an electrode structure after the sintering process at a sintering temperature of 700° C.
Figure 5:
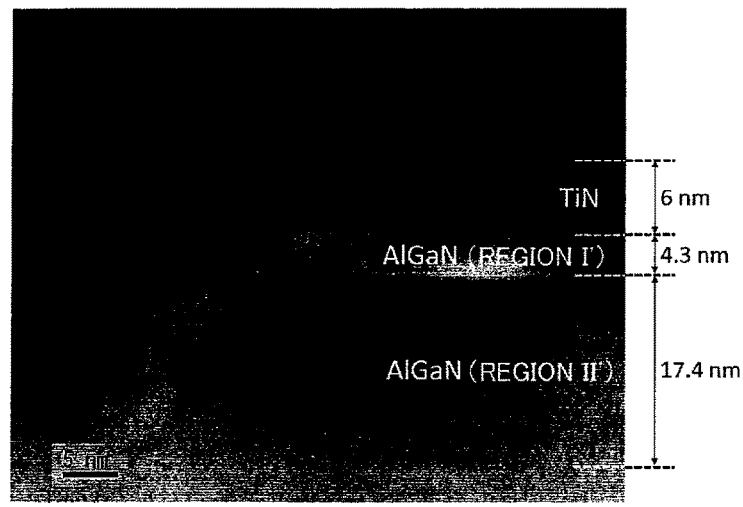
FIG. 5 is a photo showing a transmission electron micrograph of an electrode structure after the sintering process at a sintering temperature of 900° C.

FIGS. 4 and 5 show transmission electron micrographs (TEM) of these electrode structures. FIG. 4 shows a case in which the sintering process was performed at 700° C., and FIG. 5 shows a case in which the sintering process was performed at 900° C. As shown in FIG. 4, if the sintering process was performed at 700° C., TiN generated by the reaction between Ti and AlGaN was formed on AlGaN. However, AlGaN itself existed as only one layer. It can be assumed that in the process at 700° C., TiN is only formed by the reaction with only the surface region of AlGaN. In this state, it can be assumed that a high energy barrier exists in AlGaN of the region II shown in FIG. 7, and the electron movement between AlGaN and TiN is dominated by thermionic field emission.

On the other hand, as shown in FIG. 5, if the sintering process was performed at 900° C., another layer of AlGaN (region I') was formed in the region sandwiched between TiN generated by the reaction between Ti and AlGaN and AlGaN (region II') corresponding to the second semiconductor layer 104. It was revealed by chemical composition analysis that the newly generated AlGaN (region I') had a high Al content and lacked nitrogen. According to this result, the newly generated AlGaN (region I') probably corresponds to the third semiconductor layer. Initially deposited AlGaN sandwiched between GaN and AlGaN in the region I' decreased the thickness. The decrease amount almost equaled the thickness of AlGaN in the region I'.

As described above, by the above-described sintering process at a sintering temperature of 900° C., the electrode structure in the semiconductor device according to the present invention can be formed. Note that in the first embodiment, since the threading dislocation density is set to $1 \times 10^7$ $cm^{-2}$ or less using a GaN substrate, a structure in which Ti is in direct contact with GaN via a threading dislocation as reported in non-patent literature 2 is not formed, as can be seen from FIGS. 4 and 5.

Second Embodiment

Figure 6A:
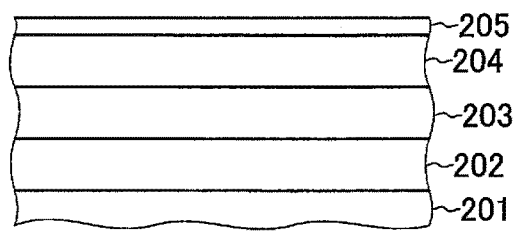
FIG. 6A is a view showing the states of steps so as to explain a semiconductor device according to the second embodiment of the present invention and a method of manufacturing the same.
Figure 6B:
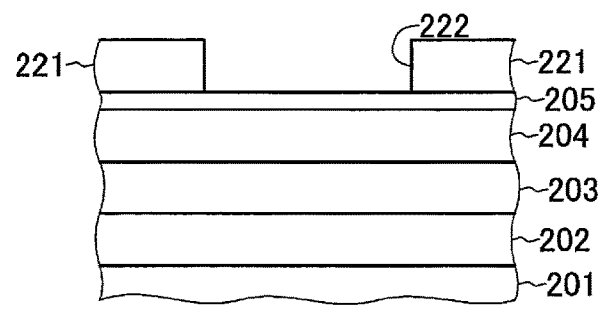
FIG. 6B is a view showing the states of steps so as to explain the semiconductor device according to the second embodiment of the present invention and the method of manufacturing the same.
Figure 6C:
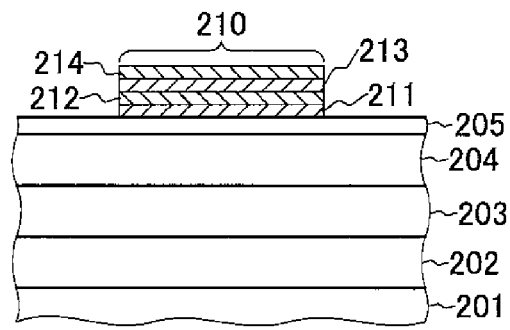
FIG. 6C is a view showing the states of steps so as to explain the semiconductor device according to the second embodiment of the present invention and the method of manufacturing the same.

The second embodiment of the present invention will be described next with reference to FIGS. 6A to 6C. FIGS. 6A to 6C are views showing the states of steps so as to explain a semiconductor device according to the second embodiment of the present invention and a method of manufacturing the same. FIGS. 6A to 6C schematically show a section.

First, as shown in FIG. 6A, a buffer layer 202, a first semiconductor layer 203, a second semiconductor layer 204, and a third semiconductor layer 205 are formed on a substrate 201 (first, second, and third steps). The second semiconductor layer 204 is formed in contact with the upper surface of the first semiconductor layer 203, and the third semiconductor layer 205 is formed in contact with the upper surface of the second semiconductor layer 204. The layers are sequentially epitaxially grown by well-known molecular beam epitaxy or metallorganic chemical vapor deposition.

The substrate 201 is a crystal substrate made of, for example, GaN having a threading dislocation density of $1 \times 10^7$ $cm^{-2}$ or less. The principal plane of the substrate 201 is the (0001) plane in the plane orientation, which is a III polar plane. The buffer layer 202 is made of, for example, GaN doped with C, Mg, Fe, or the like. If the substrate 201 has conductivity, a current flowing to the substrate 201 can be prevented by forming the buffer layer 202.

The first semiconductor layer 203 is made of a first nitride semiconductor, and the second semiconductor layer 204 is made of a second nitride semiconductor having a band gap larger than that of the first nitride semiconductor. As a combination of components, the first semiconductor layer 203 is made of undoped GaN, and the second semiconductor layer 204 is made of AlGaN. The third semiconductor layer 205 is also made of AlGaN. In this case, the first semiconductor layer 203 is formed to a thickness of about 300 nm. The second semiconductor layer 204 contains 23% Al in AlGaN and has a thickness of 17.4 nm.

As for the third semiconductor layer 205, AlGaN is epitaxially grown and then heated in a hydrogen atmosphere for about 10 min, thereby eliminating nitrogen to form nitrogen vacancies, setting the Al content to 50%, and setting the thickness to 4.3 nm. The third nitride semiconductor of the third semiconductor layer 205 having nitrogen vacancies (conductive impurity) has a sufficiently high carrier concentration, a conductivity type (n type), and a band gap not less than that of the second nitride semiconductor of the second semiconductor layer 204.

In the second embodiment as well, the substrate 201 is made of GaN. Since no lattice mismatch exists between the first semiconductor layer 203 and the substrate 201, a threading dislocation that occurs due to lattice mismatch can be suppressed. As a result, the threading dislocation density in the first semiconductor layer 203, the second semiconductor layer 204, and the third semiconductor layer 205 equals the threading dislocation density of the substrate 201 and can be $1 \times 10^7$ $cm^{-2}$ or less.

In general, when depositing a semiconductor layer on a substrate, occurrence of a dislocation can be suppressed if the thickness is not more than a so-called critical film thickness. Hence, if the substrate 201 is made of not GaN but a material with relatively small lattice mismatch, occurrence of a dislocation can be suppressed even if a nitride semiconductor layer with a practically needed thickness is deposited. For example, if a ZnO substrate or $ScAlMgO_4$ substrate whose lattice mismatch with GaN is 1.8% is used, the critical thickness is about 100 nm. Hence, the effect of the present invention can be obtained by a structure in which a nitride semiconductor layer with a practically needed thickness is deposited.

Next, as shown in FIG. 6B, a resist pattern 221 is formed on the third semiconductor layer 205. The resist pattern 221 includes, in an electrode formation region, an opening portion 222 that reaches the second semiconductor layer 204. The resist pattern 221 is formed by well-known photolithography. The resist pattern 221 is used as a lift-off mask, as will be described below.

Next, an electrode material is deposited by, for example, electron-beam evaporation, and the resist pattern 221 is lifted off, thereby forming an electrode 210 including a first metal layer 211, a second metal layer 212, a third metal layer 213, and a fourth metal layer 214, as shown in FIG. 6C (fourth step). The first metal layer 211 is formed in contact with the upper surface of the third semiconductor layer 205. For example, Ti, Al, Mo, and Au are deposited in this order, thereby forming the first metal layer 211, the second metal layer 212, the third metal layer 213, and the fourth metal layer 214.

In the second embodiment, the third semiconductor layer 205 having nitrogen vacancies and an Al content higher than that of the second semiconductor layer 204 is formed by deposition and a heat treatment in a hydrogen atmosphere without performing a sintering process. In addition, when the first metal layer 211 is formed by depositing TiN, the portion (first metal layer 211) of the electrode 210 made of a metal nitride is formed in contact with the third semiconductor layer 205. The first metal layer 211 is an electrode made of a metal nitride, and is in contact with the third semiconductor layer 205. In this step, the portion (first metal layer 211) in contact with the third semiconductor layer 205 is formed by forming an electrode made of a metal nitride in contact with the upper surface of the third semiconductor layer 205.

These components are the same as in the above-described first embodiment. The second nitride semiconductor of the second semiconductor layer 204 has a band gap with which the carrier movement between the first semiconductor layer 203 and the third semiconductor layer 205 via the second semiconductor layer 204 is rate-determined by the diffusion process. The second semiconductor layer 204 has a thickness with which the carrier movement between the first semiconductor layer 203 and the third semiconductor layer 205 via the second semiconductor layer 204 is rate-determined by the diffusion process. The second semiconductor layer 204 is formed such that the carrier movement between the first semiconductor layer 203 and the third semiconductor layer 205 via the second semiconductor layer 204 is rate-determined by the diffusion process.

As described above, in the present invention, the third semiconductor layer made of the third nitride semiconductor is provided between the electrode and the second semiconductor layer made of the second nitride semiconductor. The band gap of the second nitride semiconductor is set such that the carrier movement between the first semiconductor layer and the third semiconductor layer via the second semiconductor layer is rate-determined by the diffusion process. The thickness of the second semiconductor layer is set such that the carrier movement between the first semiconductor layer and the third semiconductor layer via the second semiconductor layer is rate-determined by the diffusion process. The carrier movement between the first semiconductor layer and the third semiconductor layer via the second semiconductor layer is rate-determined by the field emission process.

As a result, according to the present invention, it is possible to stably operate the semiconductor device made of a nitride semiconductor even in an environment with a large temperature change.

Note that the present invention is not limited to the embodiments described above, and many modifications and combinations can be made by those who have ordinary knowledge in this field within the technical scope of the present invention, as a matter of course. For example, in the above embodiments, the first nitride semiconductor is GaN, and the second nitride semiconductor and the third nitride semiconductor are AlGaN. However, the present invention is not limited to this. The first nitride semiconductor can be $In_{1-x-y}Al_xGa_yN$ ($0 \leq x \leq 1$, $0 \leq y \leq 1$, $0 \leq x+y \leq 1$). The second nitride semiconductor and the third nitride semiconductor can be $In_{1-x'-y'}Al_{x'}Ga_{y'}N$ ($0 \leq x' \leq 1$, $0 \leq y' \leq 1$, $0 \leq x'+y' \leq 1$).

EXPLANATION OF THE REFERENCE NUMERALS AND SIGNS

101 . . . substrate, 102 . . . buffer layer, 103 . . . first semiconductor layer, 104 . . . second semiconductor layer, 105 . . . third semiconductor layer, 110 . . . electrode, 111 . . . first metal layer, 112 . . . second metal layer, 113 . . . third metal layer, 114 . . . fourth metal layer, 121 . . . resist pattern, 122 . . . opening portion

The invention claimed is:

1. A semiconductor device comprising:
a first semiconductor layer including a first nitride semiconductor formed on a substrate;
a second semiconductor layer including a second nitride semiconductor having a band gap larger than that of the first nitride semiconductor, and is formed in contact with an upper surface of the first semiconductor layer;
a third semiconductor layer including a third nitride semiconductor of a conductivity type having a band gap equal to or greater than that of the second nitride semiconductor, and is formed in contact with an upper surface of the second semiconductor layer; and
an electrode including a metal nitride formed in contact with an upper surface of the third semiconductor layer,
wherein the second nitride semiconductor has a band gap with which a carrier movement between the first semiconductor layer and the third semiconductor layer via the second semiconductor layer is rate-determined by a diffusion process,
the second semiconductor layer has a thickness with which the carrier movement between the first semiconductor layer and the third semiconductor layer via the second semiconductor layer is rate-determined by the diffusion process, and
the carrier movement between the first semiconductor layer and the third semiconductor layer via the second semiconductor layer is rate-determined by a field emission process.

2. The semiconductor device according to claim 1, wherein the third nitride semiconductor has nitrogen vacancies as a conductive impurity such that a conductivity type of the third nitride semiconductor is obtained.

3. The semiconductor device according to claim 1, wherein the metal nitride is TiN.

4. The semiconductor device according to claim 1, wherein a threading dislocation density in the first semiconductor layer, the second semiconductor layer, and the third semiconductor layer is equal to or less than $1 \times 10^7$ cm$^{-2}$.

5. A method of manufacturing a semiconductor device, comprising:
the first step of forming a first semiconductor layer including a first nitride semiconductor on a substrate;
the second step of forming a second semiconductor layer including a second nitride semiconductor having a band gap larger than that of the first nitride semiconductor in contact with an upper surface of the first semiconductor layer;
the third step of forming an electrode including a metal in contact with an upper surface of the second semiconductor layer; and
the fourth step of making the metal of the electrode react with the second nitride semiconductor of the second semiconductor layer by a sintering process by heating, forming a third semiconductor layer including a third nitride semiconductor of a conductivity type having a band gap equal to or greater than that of the second nitride semiconductor in contact with an upper surface of the second semiconductor layer, and forming the electrode including a nitride of the metal in contact with an upper surface of the third semiconductor layer,
wherein in the fourth step, the sintering process is performed until
the second nitride semiconductor of the second semiconductor layer obtains a band gap with which a carrier movement between the first semiconductor layer and the third semiconductor layer via the second semiconductor layer is rate-determined by a diffusion process, and
the second semiconductor layer obtains a thickness with which the carrier movement between the first semiconductor layer and the third semiconductor layer via the second semiconductor layer is rate-determined by the diffusion process, and the carrier movement between the first semiconductor layer and the third semiconductor layer via the second semiconductor layer is rate-determined by a field emission process.

6. A method of manufacturing a semiconductor device, comprising:
the first step of forming a first semiconductor layer including a first nitride semiconductor on a substrate;
the second step of forming a second semiconductor layer including a second nitride semiconductor having a band gap larger than that of the first nitride semiconductor in contact with an upper surface of the first semiconductor layer;
the third step of forming a third semiconductor layer including a third nitride semiconductor of a conductivity type having a band gap equal to or greater than that of the second nitride semiconductor in contact with an upper surface of the second semiconductor layer; and
the fourth step of forming an electrode including a metal nitride in contact with an upper surface of the third semiconductor layer,
wherein the second nitride semiconductor has a band gap with which a carrier movement between the first semiconductor layer and the third semiconductor layer via the second semiconductor layer is rate-determined by a diffusion process,
the second semiconductor layer has a thickness with which the carrier movement between the first semiconductor layer and the third semiconductor layer via the second semiconductor layer is rate-determined by the diffusion process, and
the carrier movement between the first semiconductor layer and the third semiconductor layer via the second semiconductor layer is rate-determined by a field emission process.

7. The method of manufacturing the semiconductor device according to claim 5, wherein a threading dislocation density in the first semiconductor layer, the second semiconductor layer, and the third semiconductor layer is set to be equal to or less than $1 \times 10^7$ $cm^{-2}$ by using the substrate including a material in which lattice mismatch with the first nitride semiconductor is equal to or less than 2%.

8. The method of manufacturing the semiconductor device according to claim 6, wherein a threading dislocation density in the first semiconductor layer, the second semiconductor layer, and the third semiconductor layer is set to be equal to or less than $1 \times 10^7$ $cm^{-2}$ by using the substrate including a material in which lattice mismatch with the first nitride semiconductor is equal to or less than 2%.

9. The method of manufacturing the semiconductor device according to claim 5, wherein the metal comprises Ti.

10. The method of manufacturing the semiconductor device according to claim 6, wherein the metal comprises Ti.

* * * * *